(12) United States Patent
Martin et al.

(10) Patent No.: US 8,558,586 B1
(45) Date of Patent: Oct. 15, 2013

(54) CIRCUIT ARRANGEMENT FOR DRIVING TRANSISTORS IN BRIDGE CIRCUITS

(75) Inventors: Karl-Josef Martin, Munich (DE); Markus Zannoth, Neubiberg (DE); Karl-Dieter Hein, Schwindegg (DE); Matthias Bogus, Munich (DE); Mathias Von Borcke, Munich (DE); Benno Koeppl, Markt Indersdorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/600,003

(22) Filed: Aug. 30, 2012

(51) Int. Cl.
*H03B 1/00* (2006.01)
*H03K 3/00* (2006.01)

(52) U.S. Cl.
USPC ............ 327/108; 327/109; 327/110; 327/111

(58) Field of Classification Search
USPC ................................................ 327/108–111
See application file for complete search history.

(56) References Cited

U.S. PATENT DOCUMENTS

| | | | |
|---|---|---|---|
| 2007/0058711 A1* | 3/2007 | Risbo ............................ | 375/238 |
| 2008/0158915 A1* | 7/2008 | Williams ................... | 363/21.06 |
| 2008/0284357 A1* | 11/2008 | Ribarich ....................... | 315/309 |
| 2009/0256617 A1* | 10/2009 | Ochi ............................. | 327/333 |
| 2010/0123511 A1* | 5/2010 | Strzalkowski et al. ....... | 327/530 |
| 2010/0315150 A1* | 12/2010 | Ochi ............................. | 327/333 |
| 2011/0141780 A1* | 6/2011 | O'Malley et al. ............. | 363/123 |
| 2012/0172948 A1* | 7/2012 | Aghassian et al. ............. | 607/61 |
| 2012/0206064 A1* | 8/2012 | Archenhold .................. | 315/297 |
| 2013/0106374 A1* | 5/2013 | Ball .............................. | 323/271 |

* cited by examiner

*Primary Examiner* — Adam Houston
(74) *Attorney, Agent, or Firm* — Slater & Matsil, L.L.P.

(57) ABSTRACT

A circuit arrangement includes a half-bridge with a high-side switch and a low-side switch, each switch including a control terminal and a load path. The load paths of the high-side switch and the low-side switch are coupled in series between a terminal for a supply potential and a terminal for a reference potential a high-side driver operable to provide a high-side drive signal received at the control terminal of the high-side switch. The high-side driver includes supply terminals a charge storage device coupled between the supply terminals of the high-side driver. A control circuit includes a charging circuit, a switching element and a drive circuit operable to switch on the switching element dependent on at least one operation parameter of the circuit arrangement.

26 Claims, 7 Drawing Sheets

CIRCUIT ARRANGEMENT FOR DRIVING TRANSISTORS IN BRIDGE CIRCUITS

TECHNICAL FIELD

The present disclosure relates to a circuit arrangement for driving transistors in bridge circuits, in particular in bridge circuits that require duty cycles in a range of between 0 and 100%.

BACKGROUND

In high current bridge applications, electronic switches may be used to couple a load to a high side or a low side supply line. Mostly, n-channel Power MOSFETs are used as switches in such applications, but other kinds of switches are possible as well. In order to be able to drive the gates and the gate charges of these switches very fast, so called bridge driver integrated circuits (ICs) are used. An alternating switching of the high side and low side switches is achieved by using a pulse width modulated (PWM) signal, which defines the load current at the output of the bridge with its duty cycle.

In order to connect the output (source) of a high side n-channel power MOSFET (Metal Oxide Semiconductor Transistor) very low ohmic to the positive supply line, a gate voltage has to be generated by a high side driver stage, which lies above the positive supply voltage of the bridge. Two different methods are known, to generate this required high side driver supply.

The first method is the so called bootstrap method, where a bootstrap capacitance, which is clocked by a PWM signal, is charged during the low side phase of the bridge, low side phase meaning that the low side switch is conducting while the high side switch is not conducting. During the high side phase it then provides the gate charge which is necessary to allow an operation of the transistor. High side phase means, that the high side switch is conducting while the low side switch is not conducting. As the bootstrap capacity is only charged during the low side phase, the high side voltage cannot be maintained, if the duty cycle gets too high. Too high in this context means about 95% and more.

The second method is the charge pump method. Here, a buffer capacitance is constantly recharged with a charge pump frequency, which is independent of the PWM frequency which is used to clock the bridge transistors. Compared to the bootstrap method, the charge pump solution is more complex and therefore more costly to implement.

Because of the disadvantages of the charge pump method, the bootstrap method is used more often, even if the duty cycle is limited to below about 95%. The charge pump method, in the majority of cases, is only used, to provide a conservation charge to the bootstrap capacity, to compensate the bias and leakage currents to permanently keep the high side gate voltage (100% duty cycle).

A solution is needed, which allows duty cycles over the full range of 0 to 100%, without being too costly and complex to implement.

SUMMARY OF THE INVENTION

A first aspect relates to a circuit arrangement. The circuit arrangement includes a half-bridge with a high-side switch and a low-side switch, each comprising a control terminal and a load path, the load paths of the high-side switch and the low-side switch coupled in series between a terminal for a supply potential and a terminal for a reference potential. The circuit arrangement further includes a high-side driver operable to provide a high-side drive signal received at the control terminal of the high-side switch, and comprising supply terminals, and a charge storage device coupled between the supply terminals of the high-side driver. A control circuit includes a charging circuit coupled to a supply terminal with an input terminal and having an output terminal for providing an output voltage, a switching element coupled between the output terminal of the charging circuit and the charge storage device, and a drive circuit operable to switch on the switching element dependent on at least one operation parameter of the circuit arrangement.

A second aspect relates to A drive circuit for driving a high-side switch having a load path and a control terminal. The drive circuit includes a high-side driver operable to provide a high-side drive signal to the control terminal of the high-side switch, and including supply terminals, a charge storage device coupled between the supply terminals of the high-side driver, and a control circuit. The control circuit includes a charging circuit coupled to a supply terminal with an input terminal and having an output terminal for providing an output voltage, a switching element coupled between the output terminal of the charging circuit and the charge storage device, and a drive circuit operable to switch on the switching element dependent on at least one operation parameter of the circuit arrangement.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced. In this regard, directional terminology, such as "top," "bottom," "front," "back," "leading," "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
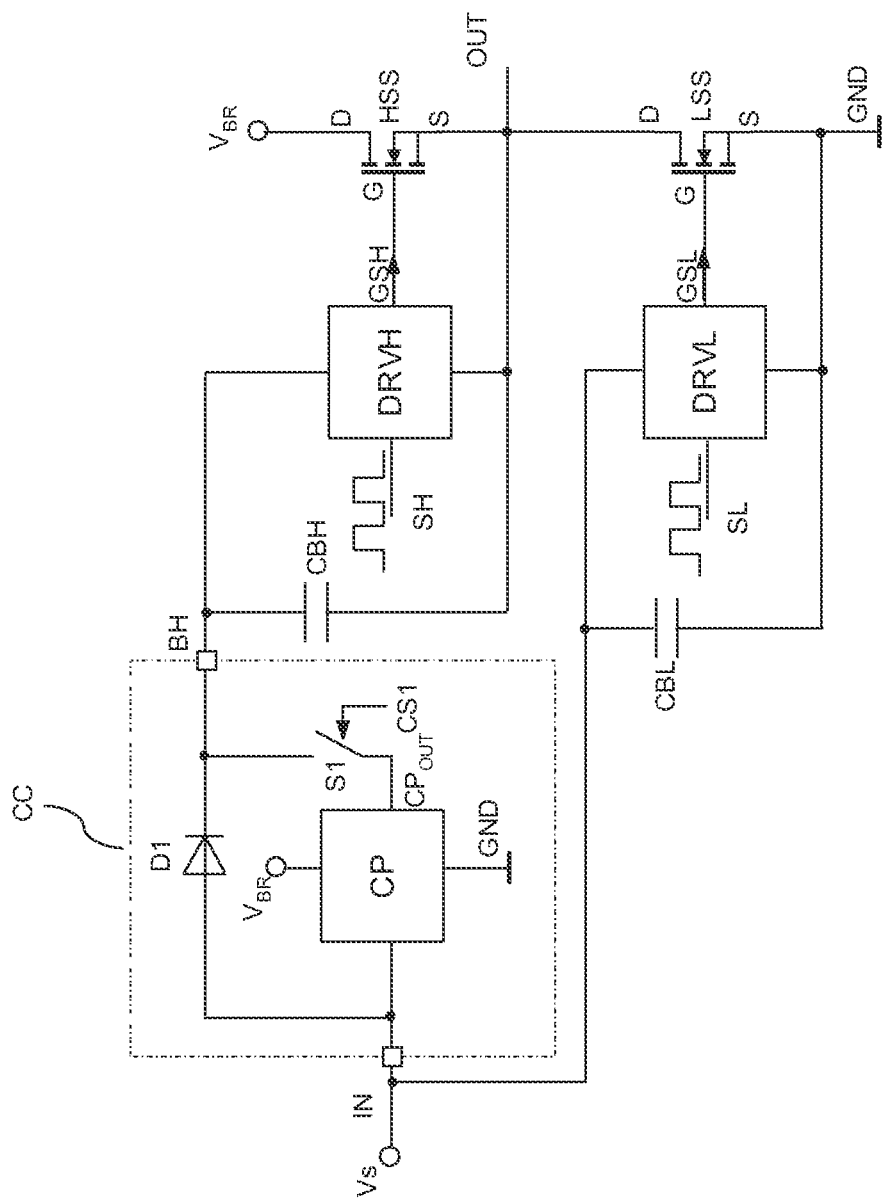
FIG. 1 illustrates a circuit arrangement including a half-bridge, a low side driver and a high side driver for the half bridge, and a charge pump according to a first embodiment.

FIG. 1 shows a circuit arrangement including a half-bridge. The half-bridge includes a high-side switch HSS and a low-side switch LSS. Each of the high-side switch HSS and the low-side switch includes a control terminal G and a load path D-S. In this embodiment, the switches HSS, LSS are implemented as n-type MOSFET devices each having a drain terminal D, a source terminal S and a gate terminal G. The gate terminals G form the control terminals of the high-side and the low-side switches HSS, LSS, and drain-source paths between the drain terminals D and the source terminals S form the load paths of the high-side and the low-side switches HSS, LSS. The load paths D-S of the high-side switch HSS and the low side switch LSS are connected in series between a terminal for a supply potential $V_{BR}$ and a terminal for a reference potential GND, such as ground. A circuit node that is common to the load paths of the high-side switch HSS and the low-side switch LSS forms an output terminal OUT of the half-bridge. In the embodiment of FIG. 1, the high-side switch HSS is coupled to the terminal for the supply potential $V_{BR}$ with its drain D and to the output terminal OUT with its source S. The low-side switch LSS is coupled to the terminal for the reference potential GND with its source S and to the output terminal OUT with its drain D.

Implementing the switches HSS, LSS of the half-bridge as n-type MOSFETs is only an example. These switches could be implemented as IGBTs (Insulated Gate Bipolar Transistors) or as p-type MOSFETs as well.

Referring to FIG. 1, the circuit arrangement further includes a first driver DRVH, which will also be referred to as high-side driver DRVH, and a second driver DRVL, which will also be referred to as low-side driver DRVL. The high-side driver DRVH is configured to generate a first drive signal (high-side drive signal) GSH received at the control terminal G of the high-side switch HSS, and the low-side driver DRVL is configured to generate a second drive signal (low-side drive signal) GSL received at the control terminal G of the low-side switch LSS. In this way, the high-side and the low-side switches HSS and LSS are each driven by the respective high-side and low-side driver DRVH, DRVL. The output terminal OUT may be coupled to a load (not illustrated in FIG. 1), for example.

The low-side driver DRVL includes first and second supply terminals for receiving a supply voltage and is configured to generate the low-side drive signal GSL from the supply voltage received at the first and second supply terminals. In the embodiment of FIG. 1, the second supply terminal of the low-side driver DRVL is coupled to the reference potential GND, while the first supply terminal is coupled to a terminal for a driver supply potential Vs. The low-side drive signal GSL is available at an output terminal of the low-side driver DRVL and either assumes an on-level that switches on the low-side switch LSS, or an off-level that switches off the low-side switch LSS. The low-side driver DRVL generates the on-level and the off-level of the low-side drive signal GSL dependent on a first input signal SL received at an input of the low-side driver DRVL. Further, a capacitive storage element CBL, such as a capacitor, is coupled between the first and second supply terminals of the low-side driver DRVL.

The high-side driver DRVH includes first and second supply terminals for receiving a supply voltage and is configured to generate the high-side drive signal GSH from the supply voltage received at the first and second supply terminals. In the embodiment of FIG. 1, the second supply terminal of the low-side driver DRVL is coupled to the output terminal OUT of the half-bridge, while the first supply terminal is coupled to an output terminal BH of a control circuit CC. The high-side drive signal GSH is available at an output terminal of the high-side driver DRVH and either assumes an on-level that switches on the high-side switch HSS, or an off-level that switches off the high-side switch HSS. The high-side driver DRVH generates the on-level and the off-level of the high-side drive signal GSH dependent on a second input signal SH received at an input of the high-side driver DRVH. Further, a capacitive storage element CBH, such as a capacitor, is coupled between the first and second supply terminals of the high-side driver DRVH.

The input terminals SH, SL are, for example, provided by a half-bridge control circuit (not illustrated) such as a microcontroller. According to one embodiment, these input signals SH, SL are generated such that the high-side switch HSS and the low-side switch LSS are not switched on at the same time in order to prevent a short-circuit between the terminals for the supply potential $V_{BR}$ and the reference potential GND. According to one embodiment, each of the first and second input signals SL, SH are pulse width-modulated signals.

Referring to FIG. 1, the control circuit CC includes an optional rectifier element D1, such as a diode, a charging circuit CP and a switch S1. A first terminal (input terminal) IN of the control circuit CC is coupled to the terminal for the driver supply potential Vs, and a second terminal (output terminal) BH is coupled to the first supply terminal of the high-side driver DRVH and, therefore, to the capacitance CBH. The rectifier element D1 is coupled between the first and second terminals IN, BH of the control circuit CC. In the embodiment of FIG. 1, where the rectifier element D1 is implemented as a diode, the anode of the diode is coupled to the first terminal IN of the control circuit CC and the cathode is coupled to the second terminal BH of the control circuit CC. The charging circuit CP includes a first terminal coupled to the terminal for the driver supply potential Vs, a second terminal coupled to the supply potential $V_{BR}$ received by the half-bridge, and a third terminal GND coupled to the reference potential GND. A fourth terminal (output terminal) of the charge pump CP is coupled to the second output BH of the control circuit CC via a switch S1S1.

The diode D1 of the control circuit CC and the capacitance CBH coupled between the first and second supply terminals of the high-side driver DRVH form a bootstrap circuit. Whenever the low-side switch LSS is switched on so that the electrical potential at the second supply terminal of the high-side driver DRVH essentially corresponds to the reference potential GND, the capacitor (bootstrap capacitor) CBH is charged through the diode D1. When the low-side switch LSS is switched off, the electrical charge stored in the bootstrap capacitor CBH or the supply voltage provided by the bootstrap capacitor, respectively, is used by the high-side driver DRVH to generate the drive signal GSH for the high-side switch HSS.

Referring to the explanation provide herein before, the high-side switch HSS and the low-side switch LSS are switched on and off alternately so that only one of these switches HSS, LSS is switched on at the same time. There are applications in which the output terminal OUT is alternately connected to the terminal for the supply potential $V_{BR}$ and the terminal for the reference potential GND at a predefined switching frequency. In this case, the high-side switch HSS and the low-side switch LSS are cyclically and alternately switched on and off at a switching frequency. Each of the high-side switch HSS and the low-side switch LSS has a duty cycle. The duty cycle $D_{HSS}$ of the high-side switch is defined as $D_{HSS}=Ton_{HSS}/T$, while the duty cycle $D_{LSS}$ of the high-side switch is defined as $D_{LSS}=Ton_{LSS}/T$, where $T=1/f$ is the duration of one switching cycle, $Ton_{HSS}$ is the on-time of the high-side switch HSS in one switching cycle, and $Ton_{LSS}$ is the on-time of the low-side switch HSS in one switching cycle. Approximately, $D_{HSS}=1-D_{LSS}$. Further, f is the switching frequency at which the high-side and low-side switches HSS, LSS are switched on and off. This frequency corresponds to the frequency of pulse width-modulated signals SH, SL received by the high-side and the low-side driver DRVH, DRVL, respectively.

As the bootstrap capacitor CBH is only charged during those phases, during which the low-side switch LSS is switched on, the generated high-side voltage across the bootstrap capacitor CBH cannot be maintained, if the duty-cycle $D_{HSS}$ of the high-side switch HSS gets too high and therefore the charging periods get too short. That is, the bootstrap capacitor CBH is not supplied with sufficient energy to supply the drive circuit DRVH when the duty cycle $D_{HSS}$ reaches a duty-cycle threshold, such as, e.g., 95%.

The charging circuit CP ensures that the supply voltage provided by the bootstrap capacitor CBH is kept high enough to supply the high-side driver DRVH even at high duty cycles $D_{HSS}$ of the high-side switch HSS. The charging circuit CP provides a charging current to the bootstrap capacitor CBH independent of the duty cycle of the high-side switch HSS. In this way, the bootstrap circuit, for duty cycles of about 95% and lower, and the charging circuit, for duty cycles of more than about 95%, are combined within one circuit arrangement, allowing operation of the half-bridge transistors over the full duty cycle range of 0-100%.

The switch S1 either connects the charging circuit CP to the bootstrap capacitor CBH, or disconnects the charging circuit CP from the bootstrap capacitor CBH. The charging circuit CP may be disconnected (switch S1 open) as long as the bootstrap circuit with the diode D1 and the bootstrap capacitor CBH provides sufficient energy, e.g., at duty cycles below about 95%. The charging circuit CP may be connected to the bootstrap capacitor (switch S1 closed) when the bootstrap capacitor CBH does not provide sufficient energy. For example, this may be the case when the duty-cycle of the high-side switch HSS is higher than a duty-cycle threshold, such as 95%.

When the charging circuit CP (switch S1 closed) is connected to the bootstrap capacitor CBH, the bootstrap capacitor CBH is recharged by the charging circuit. The charging circuit CP may be implemented as a charge pump. A charge pump CP generally is a kind of DC to DC converter that uses capacitors as energy storage elements to create an output voltage higher than an input voltage. The charge pump of FIG. 1 is configured to provide an output voltage at the output terminal $CP_{OUT}$ that is higher than the half-bridge supply voltage between the terminals for the supply potential $V_{BR}$ and the reference potential GND.

The charging circuit CP can be implemented in many different ways. Just for explanation purposes, one embodiment for implementing the charging circuit CP is explained with reference to FIG. 2 below.

Figure 2:
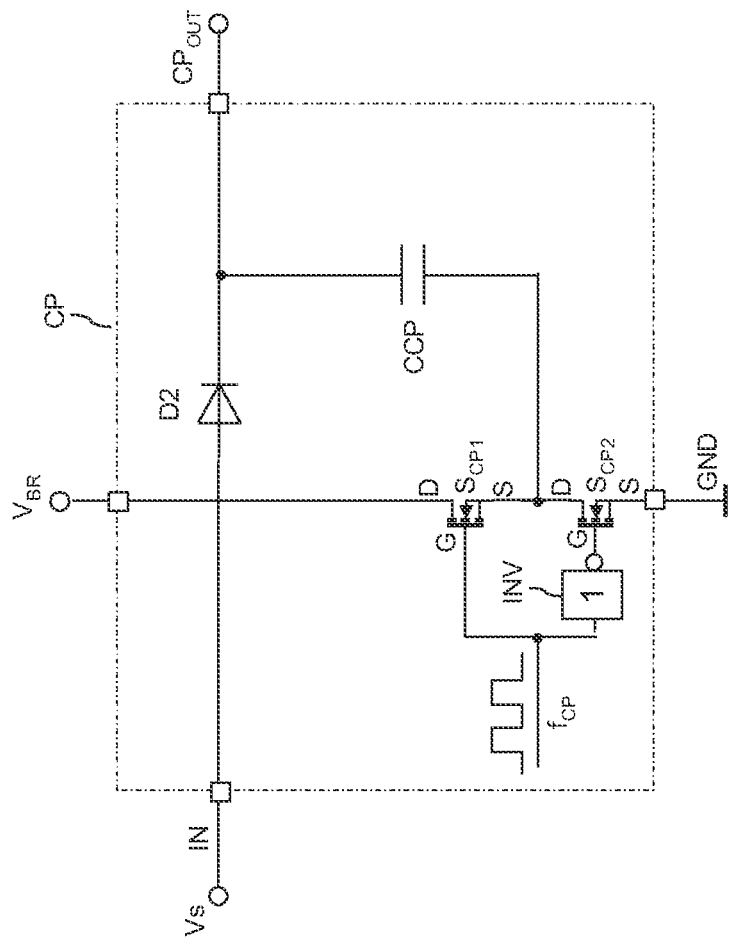
FIG. 2 illustrates one embodiment of a charge pump.

The charging circuit CP of FIG. 2 is implemented as a charge pump and includes a diode D2, a capacitor CCP and two charge pump switches $S_{CP1}$, $S_{CP2}$, which in this case are implemented as n-type MOSFETs. An anode of the diode D2 is coupled to a first terminal IN of the charge pump CP, which corresponds to the first terminal of the control circuit CC, and a cathode of the diode D2 is coupled to a second terminal $CP_{OUT}$ of the charge pump CP. The first charge pump switch $S_{CP1}$ is coupled to the terminal for the supply potential $V_{BR}$ with its drain D and to the drain D of the second charge pump switch $S_{CP2}$ with its source S. The second charge pump switch $S_{CP2}$ is coupled to reference potential GND with its source S and to the source S of the first charge pump switch $S_{CP1}$ with its drain D. The gate G of one charge pump switch (the first charge pump switch $S_{CP1}$ in the present embodiment) receives a clock signal $f_{CP}$, while the gate of the other charge pump switch (the second charge pump switch $S_{CP2}$ in the present embodiment) receives the inverted clock signal $f_{CP}$ through an inverter INV. The clock signal $f_{CP}$ may be generated by a clock generator (not illustrated) in the charge pump CP or by an external clock generator that provides the clock signal to the charge pump CP.

A first terminal of the capacitor CCP is coupled to the second terminal $CP_{OUT}$ of the charge pump CP, and a second terminal of the capacitor CCP is coupled to a circuit node common to the first charge pump switch $S_{CP1}$ and the second charge pump switch $S_{CP2}$.

The operating principle of the charging circuit CP is as follows. During a first phase, the second charge pump switch $S_{CP2}$ is conductive (switched on), while the first charge pump switch $S_{CP1}$ is not conductive (switched off). The capacitor CCP is therefore charged via the diode D2. The maximum supply voltage available across the capacitor corresponds to the driver supply voltage, which is the voltage between the terminal for the driver supply potential Vs and the terminal for the reference potential GND, minus the forward voltage of the diode D2 and the voltage drop across the low side switch. During a second phase, the first charge pump switch $S_{CP1}$ is conductive, while the second charge pump switch $S_{CP2}$ is not conductive. The voltage $V_{BR}$ and the voltage Vs at the charge pump capacitor CCP are then coupled in series. The charge pump capacitor CCP is therefore charged to $Vs+V_{BR}-V_{D2}$, where $V_{D2}$ is the forward voltage of the diode D2. This cycle is then repeated. In this way, it provides a voltage of $Vs+V_{BR}$ at its terminal $CP_{OUT}$, that is high enough to allow operation of the high-side driver DRV1. According to one embodiment, the charging circuit CP is always activated independent on whether the switch (S1 in FIG. 1) is switched on or switched off, while energy is only transferred to the bootstrap capacitor CBH when the switch S1 is switched on.

In general, the switch S1 is driven dependent on at least one operation parameter of the circuit arrangement by a drive circuit (not illustrated in FIG. 1) that provides the drive signal CS1. Different embodiments of driving the switch S1 are explained below.

Figure 3:
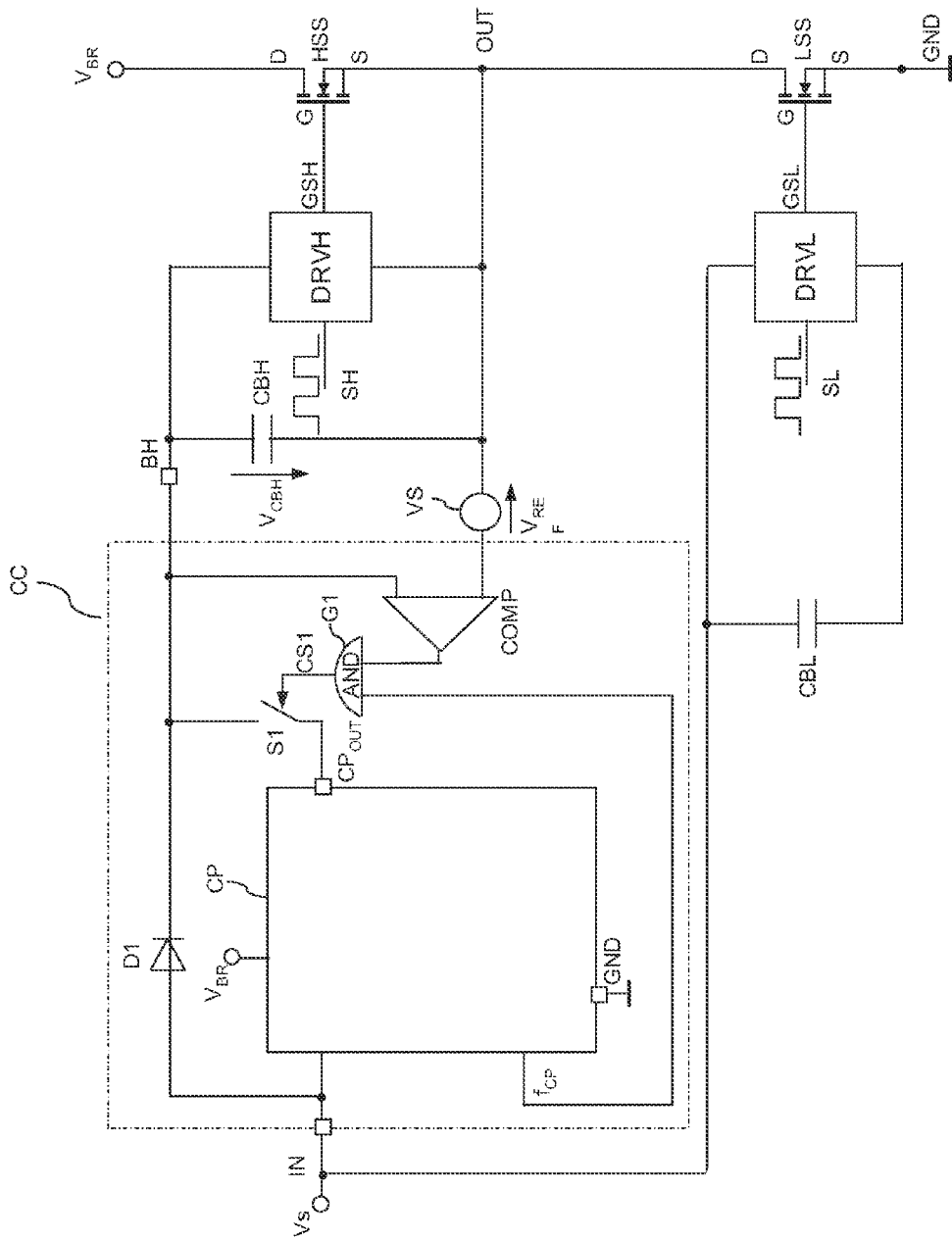
FIG. 3 illustrates a circuit arrangement including a half-bridge in detail according to a first embodiment.

FIG. 3 illustrates one embodiment of driving the switch S1 connected between the charging circuit CP and the bootstrap capacitor CBH in detail. FIG. 3 illustrates a circuit arrangement that is based on the circuit arrangement of FIG. 1 and that includes additional circuit means for switching the switch S1. These circuit means include a logic gate G1 and a comparator COMP. The logic gate G1 may be implemented as an AND gate. The charging circuit of FIG. 3 may be implemented like the charging circuit of FIG. 2.

Referring to FIG. 3, the logic gate G1 receives a comparator output signal from the comparator COMP and the clock signal $f_{CP}$ from the charging circuit CP. The comparator COMP is operable to compare a voltage $V_{CBH}$ across the bootstrap capacitor CBH with a reference voltage $V_{REF}$. For this, the comparator COMP has a first terminal (such as the non-inverting input) coupled to a first terminal of the bootstrap capacitor CBH and has a second terminal (such as the inverting input) coupled to a second terminal of the bootstrap capacitor CBH via a reference voltage source VS providing the reference voltage $V_{REF}$. It is desired to charge the bootstrap capacitor CBH when the voltage $V_{CBH}$ across the bootstrap capacitor CBH falls below the reference voltage $V_{REF}$. In the embodiment of FIG. 3, the switch S1 is switched on each time, the comparator output signal indicates that the voltage $V_{CBH}$ across the bootstrap capacitor CBH is below the reference voltage $V_{REF}$ and the clock signal $f_{CP}$ has a predefined signal level. According to one embodiment, the predefined signal level of the clock signal $f_{CP}$ is a high-signal level. The output voltage of the charging circuit CP has a maximum when the clock signal $f_{CP}$ has a high level, so that the switch S1 is only closed in those time periods in which the charging circuit output voltage has a maximum.

Figure 4:
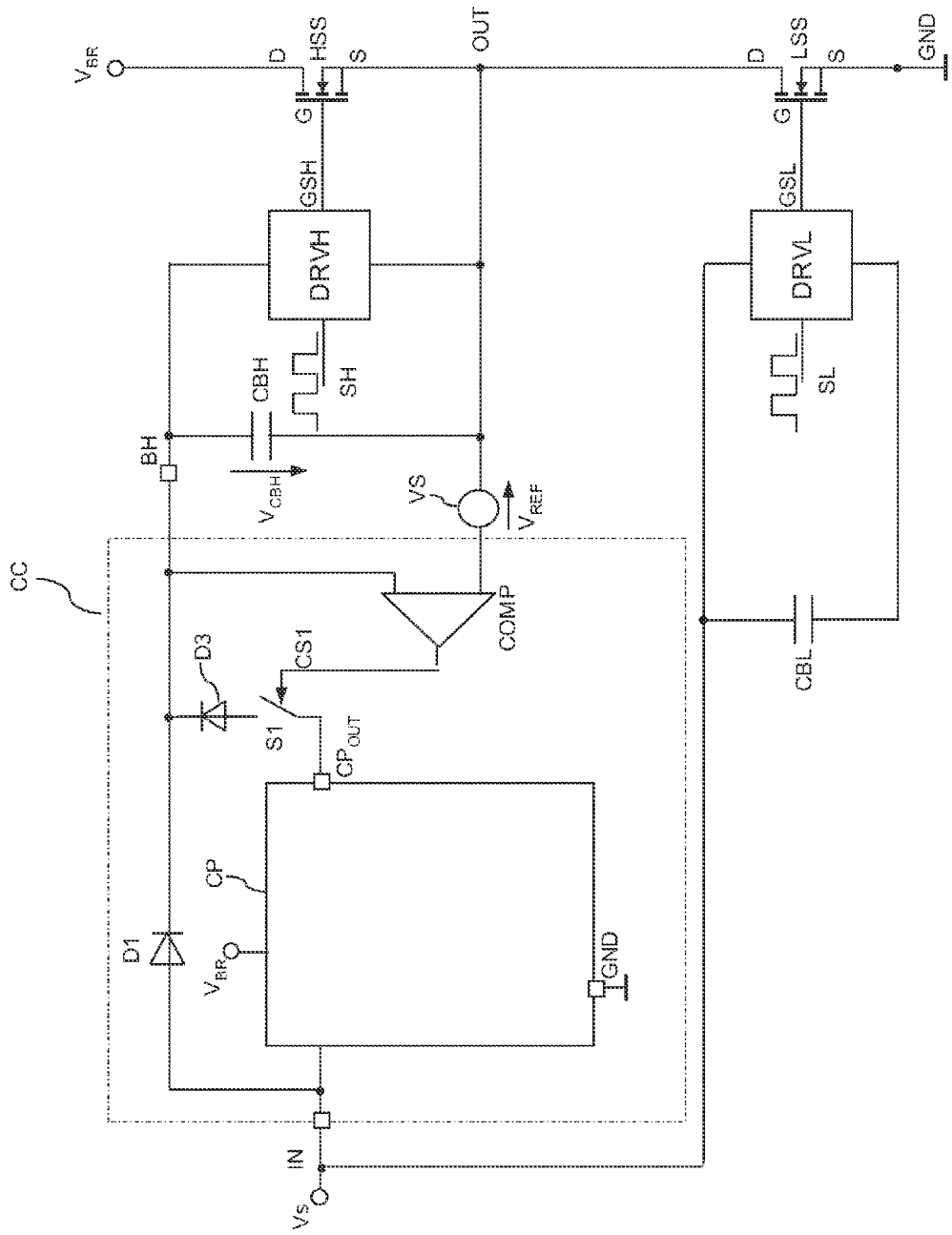
FIG. 4 illustrates a circuit arrangement including a half-bridge in detail according to a second embodiment.

Alternatively, as illustrated in FIG. 4, the logic gate G1 is omitted and the switch S1 is only driven dependent on the comparator COMP output signal such that the switch S1 is switched on each time and as long as the bootstrap voltage $V_{CBH}$ is below the reference voltage $V_{REF}$. In this case, a further diode D3 may be connected in series with the switch S1. This diode may prevent the bootstrap capacitor CBH from being discharged into the charging circuit CP in those time periods in which the output voltage of the charging circuit is low (corresponding to the supply voltage Vs in FIG. 2).

Figure 5:
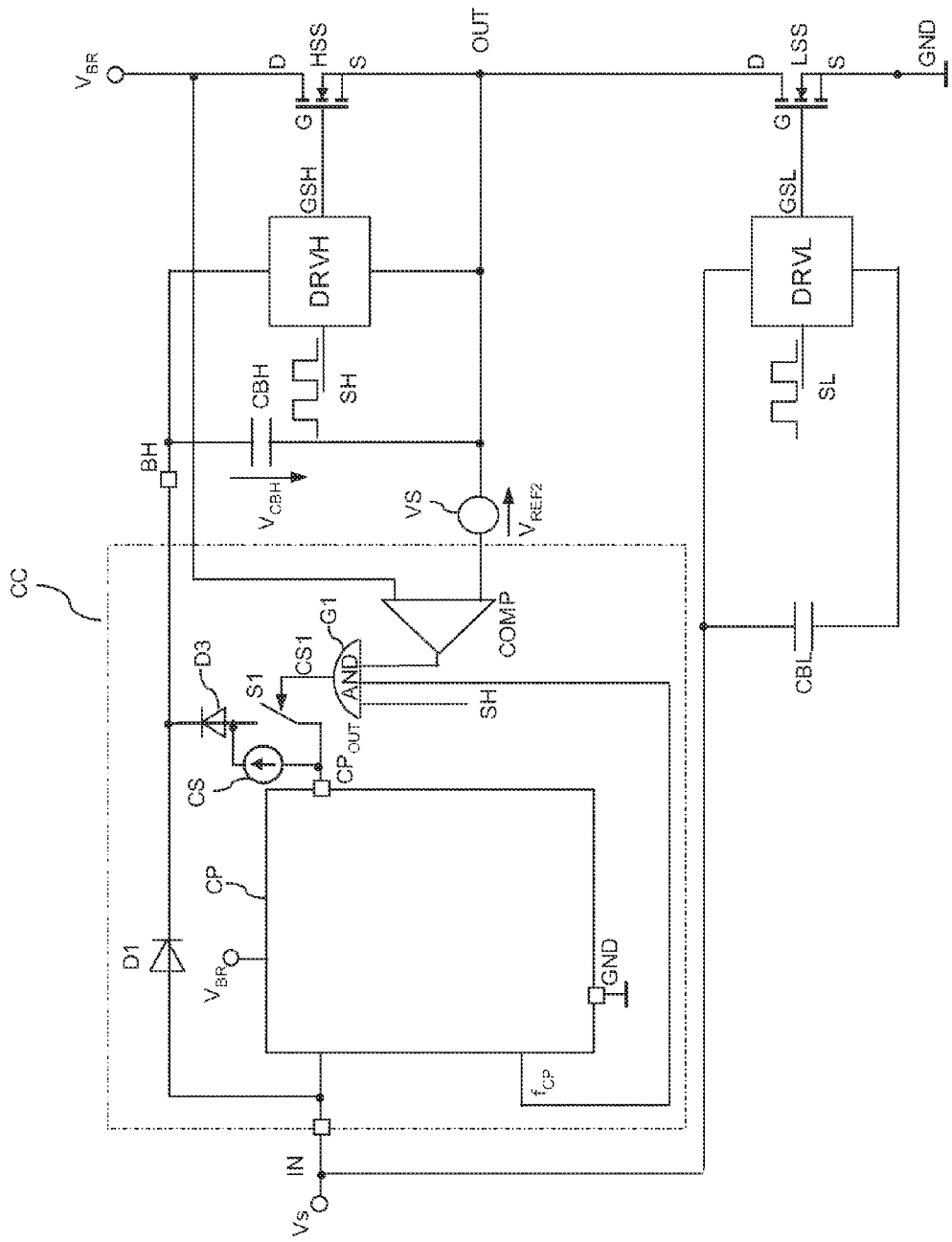
FIG. 5 illustrates a circuit arrangement including a half-bridge in detail according to a third embodiment.

According to a further embodiment illustrated in FIG. 5, it is desirable to switch on the switch S1 each time the high-side switch HSS is switched on. For this, the logic gate G1 receives the high-side drive signal SH and the comparator output signal, where the comparator COMP compares the load path voltage (the voltage between the drain and source terminals) of the high-side switch HSS with a further reference voltage $V_{REF2}$. The logic gate G1 is configured to switch on the switch S1 when the drive signal SH has an on-level, indicating that it is desired to switch on the high-side switch HSS, and when the comparator signal indicates that the load path voltage is below the further reference voltage $V_{REF2}$. The further reference voltage is selected such that the load path voltage only falls below the further reference voltage when the high-side switch HSS has switched on. Optionally, the logic gate G1 further receives the clock signal $f_{CP}$ so that the switch S1 is only switched on when the clock signal $f_{CP}$ has a predefined signal level, such as a high level. Optionally, and in particular when the clock signal $f_{CP}$ is not received by the logic gate G1, the further diode D3 is connected in series with the switch.

In order to prevent the bootstrap capacitor CBH from being discharged through leakage currents when the high-side switch HSS has not been switched on for a long time, an optional current source CS is connected in parallel with the switch S1. The current source CS is supplied by the charging circuit and provides a charging current that compensates leakage losses of the bootstrap capacitor CBH.

Figure 6:
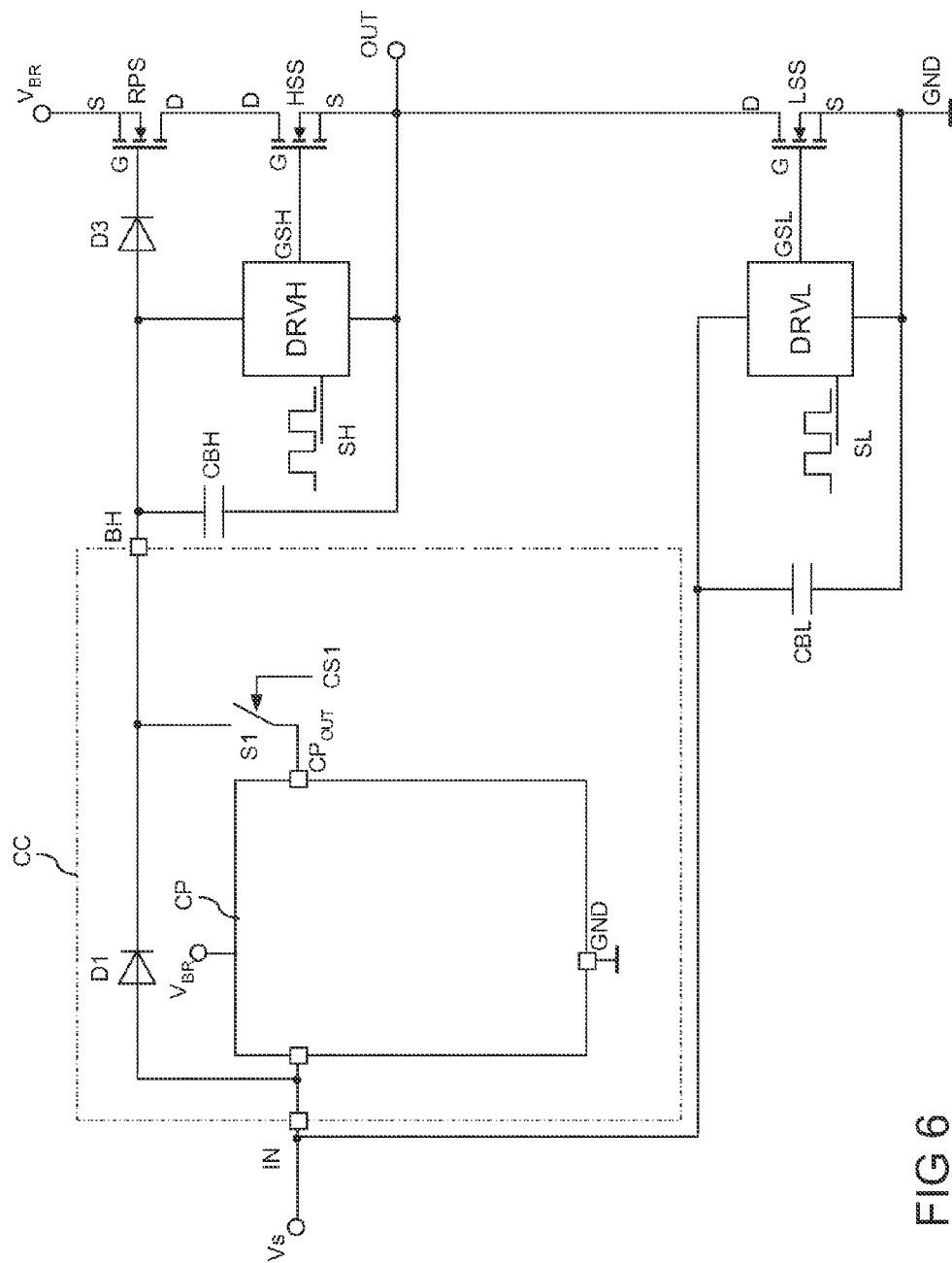
FIG. 6 illustrates a circuit arrangement including a half-bridge according to a further embodiment.

In some embodiments, it may be necessary to protect the components against reverse polarity. Components may be severely damaged, if a reverse polarity situation arises. In FIG. 6, a modification of the circuit arrangement of FIG. 1 is illustrated. The circuit of FIG. 6 further includes a reverse polarity protection. For this purpose, a reverse polarity switch RPS is included in the circuit arrangement. In this embodiment, the reverse polarity switch RPS is implemented as an n-channel MOSFET, for example. The reverse polarity switch RPS is coupled to the terminal for positive potential $V_{BR}$ with its source S and to the drain D of the high-side switch HSS with its drain D. With its gate G, the reverse polarity switch RPS is coupled to the cathode of a diode D3. The diode D3 is further coupled to the terminal BH of the control circuit CC with its anode. The reverse polarity switch RPS is fully turned on when the supply voltage is applied in the right direction. A MOSFET always has an intrinsic anti parallel body diode, which is forward biased, when the polarity is correct. When a reverse polarity situation occurs, the internal body diode is reverse biased. In this way, it provides a reverse polarity protection. A charge pump is needed as well as for the high-side switch HSS, to boost the gate voltage over the source voltage to turn the MOSFET on. This is why the gate G of the reverse polarity switch RPS is coupled to the terminal BH of the control circuit CC over the diode D3. In the circuit of FIG. 6, the switch S1 may be controlled in one of the ways explained above.

There are alternative ways to implement a reverse polarity protection in the circuit arrangement which is shown. Depending on the application, the circuit arrangement topology may be adapted for performance and/or area optimization. Also depending on the application, an H-bridge or 3-phase bridge, for example, may be used instead of a half-bridge. In such cases, the shown signal paths have to be multiplied in parallel, according to the number of half-bridges that are used.

By combining a bootstrap operation and a charge pump operation within one circuit arrangement, the function blocks of the charge pump CP and high-side driver DRV1 can be designed and optimized according to the demanded boundary conditions independent of the circuit arrangement and without having to intervene in the general circuit structure. Boundary conditions could be the gate charge, the bias and leakage currents to be driven, a demanded duty cycle, rise, fall, turn, on or off propagation times, a gate voltage to be reached and many more.

By combining the input voltages depending on the switching states of the bridge transistors, the circuit arrangement ensures that the charge pump CP is always working in the envisioned high-side operating point. Thus, the charge pump may be designed with a chip size which is optimized according to the requirements like load current, voltage or duty cycle, for example, because no unnecessary load currents, dissipation losses or extension of settling or turn on times are produced.

The charge pump is not loaded with the gate charge currents for duty cycles up to about 95% and only needs to close the gap for duty cycles between about 95 and 100%. For applications, in which only duty cycles from 0 to 95% and 100% and reverse polarity protection are required respectively, it is sufficient to dimension the charge pump for conservation charging of the bias and leakage currents.

The circuit arrangements explained with reference to FIGS. 1, and 3 to 6 includes one control circuit CC and one half-bridge with a high-side switch HSS and a low-side switch LSS. The control circuit CC, however, may be used to supply the bootstrap capacitors of two or more half-bridge circuits.

Figure 7:
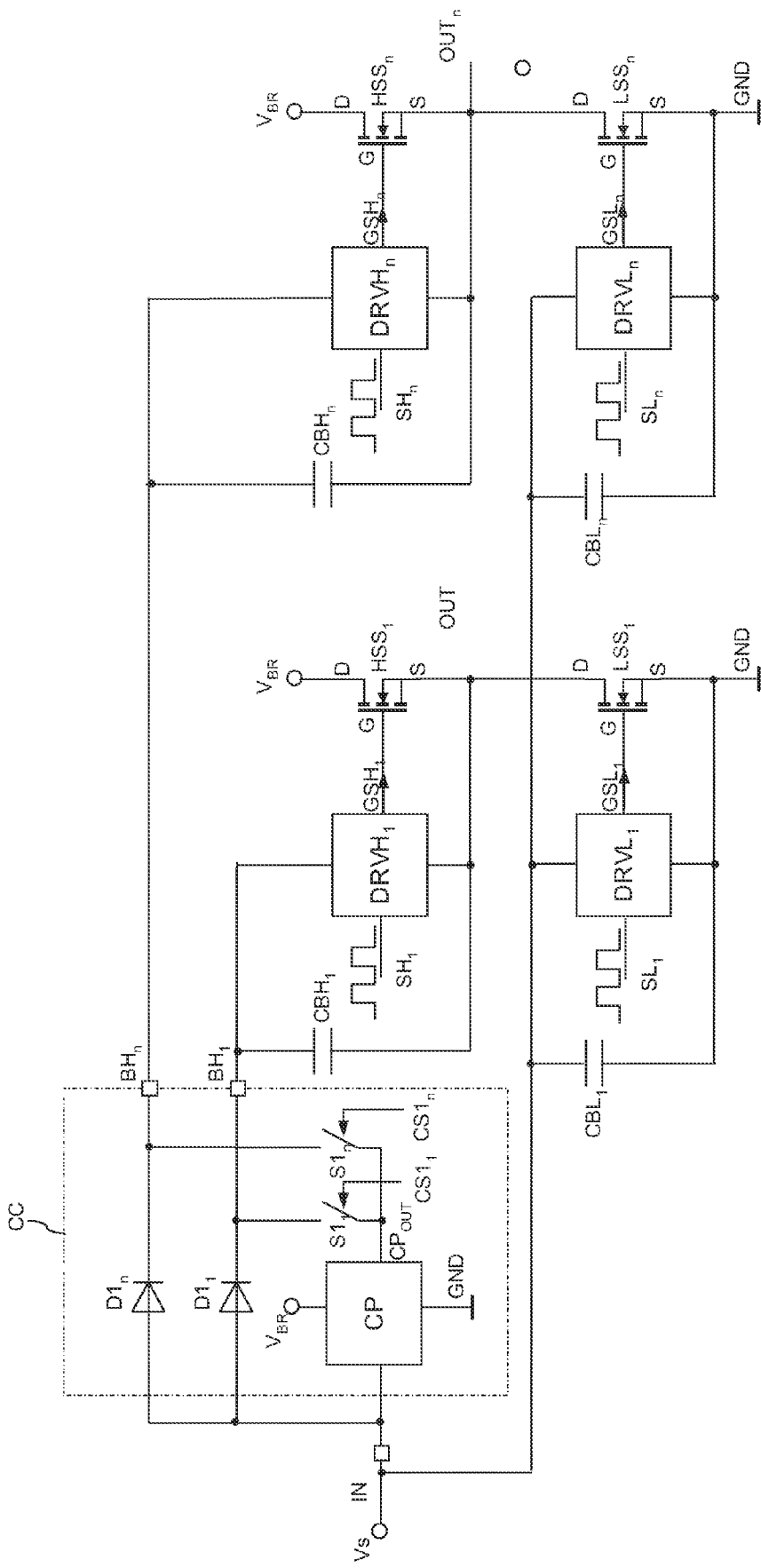
FIG. 7 illustrates a circuit arrangement including n, with n≥2, half-bridges according to one embodiment.

FIG. 7 illustrates a circuit arrangement that includes n, with $n \geq 2$, half-bridges. In the embodiment of FIG. 7, the circuit arrangement includes n=2 half-bridges. However, this is only an example, more than n=2 half-bridges may be implemented as well. Each of the half-bridges of FIG. 7 is implemented like the half-bridge of FIG. 1, so that like features have like reference characters, where the reference characters of one of the half-bridges of FIG. 7 additionally have a subscript index "1," while the reference characters of the other one of the half-bridges of FIG. 7 additionally have a subscript index "n."

Referring to FIG. 7, the control circuit CC includes n outputs $BH_1$, $BH_n$, namely one for each half-bridge. Each output $BH_1$, $BH_n$ is coupled to the bootstrap capacitor $CBH_1$, $CBH_n$ of one high-side switch $HSS_1$, $HSS_n$. Further, a rectifier element $D1_1$, $D1_n$ is connected between the input IN and each of the outputs $BH_1$, $BH_n$. The control circuit CC further includes one charging circuit and one switch $S1_1$, $S1_n$, corresponding to the switch S1 explained before, connected between the output of the charging circuit CP and each of the outputs $BH_1$, $BH_n$. Each of the switches is controlled through a control signal $CS1_1$, $CS1_n$ corresponding to the control signal CS1 explained before. Each of the switches may be controlled in the way explained before with reference to switch S1 dependent on the bootstrap voltage of the associated bootstrap capacitor $CBH_1$, $CBH_n$ or dependent on the load path voltage of the associated high-side switch $HSS_1$, $HSS_n$. The associated bootstrap capacitor $CBH_1$, $CBH_n$ is the bootstrap capacitor coupled to the respective switch $S1_1$, $S1_n$.

In the circuit arrangement of FIG. 7, there are two low-side capacitors $CBL_1$, $CBL_n$. However, since both capacitors are connected between the same supply terminals, one capacitor would be sufficient for supplying both low-side drivers $DRVL_1$, $DRVL_n$.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

Although present embodiments and its advantages have been described in detail, it should be understood that various changes, substitutions and alterations can be made herein without departing from the spirit and the scope of the invention as defined by the appended claims. With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A circuit arrangement comprising:
   a half-bridge with a high-side switch and a low-side switch, each switch comprising a control terminal and a load path, the load paths of the high-side switch and the low-side switch coupled in series between a terminal for a supply potential and a terminal for a reference potential;
   a high-side driver operable to provide a high-side drive signal received at the control terminal of the high-side switch, the high-side driver comprising supply terminals;
   a charge storage device coupled between the supply terminals of the high-side driver; and
   a control circuit comprising:
      a charging circuit with an input terminal coupled to a supply terminal and having an output terminal for providing an output voltage,
      a switching element coupled between the output terminal of the charging circuit and the charge storage device, and
      a drive circuit operable to switch on the switching element dependent on at least one operation parameter of the circuit arrangement.

2. The circuit arrangement of claim 1, wherein the charging circuit further comprises a rectifier element coupled between the input terminal and the charge storage device.

3. The circuit arrangement of claim 1, wherein the drive circuit is configured to switch on the switching element dependent on at least one of a voltage across the charge storage device, a load path voltage of the high-side switch, and a drive signal of the high-side switch.

4. The circuit arrangement of claim 3, wherein the drive circuit is configured to switch on the switching element when the voltage across the charge storage device is below a reference voltage.

5. The circuit arrangement of claim 4, wherein the charging circuit includes a charge pump receiving a clock signal, wherein the drive circuit is configured to switch on the switching element when additionally the clock signal has a predefined signal level.

6. The circuit arrangement of claim 3, wherein the drive circuit is configured to switch on the switching element when a duty cycle of the drive signal of the high-side switch is above a predefined duty-cycle threshold.

7. The circuit arrangement of claim 6, wherein the duty cycle threshold is between 75% and 90%.

8. The circuit arrangement of claim 3, wherein the drive circuit is configured to switch on the switching element when the drive signal of the high-side switch has an on-level.

9. The circuit arrangement of claim 8, wherein the charging circuit includes a charge pump receiving a clock signal, wherein the drive circuit is configured to switch on the switching element when additionally a load path voltage of the high-side switch is below a predefined voltage threshold.

10. The circuit arrangement of claim 9, wherein the charging circuit includes a charge pump receiving a clock signal, wherein the drive circuit is configured to switch on the switching element when additionally the clock signal has a predefined signal level.

11. The circuit arrangement of claim 1, wherein the charging circuit further comprises a charge pump.

12. The circuit arrangement of claim 1, wherein the charging circuit further comprises a rectifier element connected in series with the switching element.

13. The circuit arrangement of claim 1, wherein the charging circuit further comprises a current source connected in parallel with the switching element.

14. The circuit arrangement of claim 1, further comprising a reverse polarity protection circuit.

15. The circuit arrangement of claim 14, wherein the reverse polarity protection circuit comprises a reverse polarity switch, which is coupled in series with the high-side and the low-side switch.

16. The circuit arrangement of claim 15, wherein the reverse polarity switch comprises a MOSFET device, a drain of the reverse polarity switch being coupled to a drain of the high-side switch and a gate of the reverse polarity switch being coupled to the output of the control circuit.

17. A circuit arrangement for driving a high-side switch having a load path and a control terminal, the circuit arrangement comprising:
   a high-side driver operable to provide a high-side drive signal to the control terminal of the high-side switch, the high-side driver comprising supply terminals;
   a charge storage device coupled between the supply terminals of the high-side driver; and
   a control circuit comprising:
      a charging circuit coupled to a supply terminal with an input terminal and having an output terminal for providing an output voltage, a switching element coupled between the output terminal of the charging circuit and the charge storage device, and a drive circuit operable to switch on the switching element dependent on at least one operation parameter of the circuit arrangement.

18. The circuit arrangement of claim 17, wherein the charging circuit further comprises a rectifier element coupled between the input terminal and the charge storage device.

19. The circuit arrangement of claim 17, wherein the drive circuit is configured to switch on the switching element dependent on at least one of a voltage across the charge storage device, a load path voltage of the high-side switch, and a drive signal of the high-side switch.

20. The circuit arrangement of claim 19, wherein the drive circuit is configured to switch on the switching element when the voltage across the charge storage device is below a reference voltage.

21. The circuit arrangement of claim 20, wherein the charging circuit includes a charge pump receiving a clock signal, wherein the drive circuit is configured to switch on the switching element when additionally the clock signal has a predefined signal level.

22. The circuit arrangement of claim 19, wherein the drive circuit is configured to switch on the switching element when a duty cycle of the drive signal of the high-side switch is above a predefined duty-cycle threshold.

23. The circuit arrangement of claim 22, wherein the duty cycle threshold is between 75% and 90%.

24. The circuit arrangement of claim 19, wherein the drive circuit is configured to switch on the switching element when the drive signal of the high-side switch has an on-level.

25. The circuit arrangement of claim 24, wherein the charging circuit includes a charge pump receiving a clock signal, wherein the drive circuit is configured to switch on the switching element when additionally a load path voltage of the high-side switch is below a predefined voltage threshold.

26. The circuit arrangement of claim 19, wherein the charging circuit includes a charge pump receiving a clock signal, wherein the drive circuit is configured to switch on the switching element when additionally the clock signal has a predefined signal level.

* * * * *